(12) United States Patent
Park et al.

(10) Patent No.: US 10,367,332 B2
(45) Date of Patent: Jul. 30, 2019

(54) EDGE EMITTING LASER LIGHT SOURCE AND 3D IMAGE OBTAINING APPARATUS INCLUDING THE SAME

(71) Applicant: SAMSUNG ELECTRONICS CO., LTD., Suwon-si (KR)

(72) Inventors: Changyoung Park, Yongin-si (KR); Byunghoon Na, Suwon-si (KR); Yonghwa Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/288,118

(22) Filed: Oct. 7, 2016

(65) Prior Publication Data

US 2017/0104314 A1    Apr. 13, 2017

(30) Foreign Application Priority Data

Oct. 8, 2015  (KR) .................. 10-2015-0141820
Apr. 15, 2016 (KR) .................. 10-2016-0046501

(51) Int. Cl.
| | | |
|---|---|---|
| *H01S 5/12* | (2006.01) | |
| *H01S 5/02* | (2006.01) | |
| *H01S 5/10* | (2006.01) | |
| *H01S 5/125* | (2006.01) | |

(Continued)

(52) U.S. Cl.
CPC .......... *H01S 5/1237* (2013.01); *H01S 5/0206* (2013.01); *H01S 5/1021* (2013.01); *H01S 5/125* (2013.01); *H01S 5/026* (2013.01); *H01S 5/4031* (2013.01); *H01S 5/4087* (2013.01)

(58) Field of Classification Search
CPC ...... H01S 5/1203; H01S 5/1215; H01S 5/125; H01S 5/408; H01S 5/4087
See application file for complete search history.

(56) References Cited

U.S. PATENT DOCUMENTS

| | | | |
|---|---|---|---|
| 4,514,073 A | 4/1985 | Taniguchi et al. | |
| 4,883,561 A | 11/1989 | Gmitter et al. | |
| 4,993,036 A | 2/1991 | Ikeda et al. | |

(Continued)

FOREIGN PATENT DOCUMENTS

| | | |
|---|---|---|
| JP | 61-191093 A | 8/1986 |
| JP | 2002350542 A | 12/2002 |

(Continued)

OTHER PUBLICATIONS

Communication dated Feb. 13, 2017 issued by the European Patent Office in counterpart European Patent Application No. 16192410.5.

(Continued)

*Primary Examiner* — Michael Carter
(74) *Attorney, Agent, or Firm* — Sughrue Mion, PLLC

(57) ABSTRACT

An edge emitting laser light source and a three-dimensional (3D) image obtaining apparatus including the edge emitting laser light source are provided. The edge emitting laser light source includes a substrate; an active layer disposed on the substrate; a wavelength selection section comprising grating regions configured to select wavelengths of light emitted from the active layer; and a gain section configured to resonate the light having the selected wavelengths in a direction parallel with the active layer.

21 Claims, 31 Drawing Sheets

(51) Int. Cl.
H01S 5/40 (2006.01)
H01S 5/026 (2006.01)

(56) References Cited

U.S. PATENT DOCUMENTS

| | | | |
|---|---|---|---|
| 4,999,842 A * | 3/1991 | Huang | H01S 5/041 |
| | | | 257/15 |
| 5,043,991 A * | 8/1991 | Bradley | H01S 5/125 |
| | | | 372/32 |
| 5,345,328 A | 9/1994 | Fritz et al. | |
| 5,784,399 A * | 7/1998 | Sun | B82Y 20/00 |
| | | | 257/14 |
| 6,331,911 B1 | 12/2001 | Manassen et al. | |
| 6,646,724 B2 | 11/2003 | Benz et al. | |
| 6,836,350 B2 | 12/2004 | Singh et al. | |
| 7,450,220 B2 | 11/2008 | O'Connor et al. | |
| 7,542,863 B2 | 6/2009 | Drescher et al. | |
| 8,379,286 B2 | 2/2013 | Klotzkin et al. | |
| 9,123,164 B2 | 9/2015 | Park et al. | |
| 9,400,175 B2 | 7/2016 | Luthi et al. | |
| 2002/0181532 A1 | 12/2002 | Ryu et al. | |
| 2003/0063647 A1* | 4/2003 | Yoshida | H01S 5/06256 |
| | | | 372/50.1 |
| 2003/0147434 A1* | 8/2003 | Hong | H01S 5/1228 |
| | | | 372/25 |
| 2008/0013881 A1 | 1/2008 | Welch et al. | |
| 2013/0194787 A1 | 8/2013 | Geske et al. | |
| 2013/0201183 A1* | 8/2013 | Park | G06T 15/08 |
| | | | 345/419 |
| 2013/0208743 A1 | 8/2013 | Capasso et al. | |
| 2014/0160254 A1 | 6/2014 | Pelman et al. | |
| 2014/0191196 A1 | 7/2014 | Cho et al. | |
| 2015/0156479 A1 | 6/2015 | You et al. | |
| 2015/0160481 A1 | 6/2015 | Park et al. | |
| 2016/0057340 A1 | 2/2016 | You et al. | |
| 2016/0142701 A1 | 5/2016 | Jeon et al. | |

FOREIGN PATENT DOCUMENTS

| | | |
|---|---|---|
| JP | 2007132932 A | 5/2007 |
| KR | 1020130091194 A | 8/2013 |
| KR | 1020140085507 A | 7/2014 |

OTHER PUBLICATIONS

R. D. Martin, et al., "CW Performance of an InGaAs—GaAs—AlGaAs Laterally-Coupled Distributed Feedback (LC-DFB) Ridge Laser Diode", IEEE Photonics Technology Letters, vol. 7, No. 3, Mar. 1995, pp. 244-246.

A. Klehr, et al., "Five-hundred-milliwatts distributed-feedback diode laser emitting at 940nm", Optics & Laser Technology, vol. 39, 2007, pp. 333-337.

* cited by examiner

EDGE EMITTING LASER LIGHT SOURCE AND 3D IMAGE OBTAINING APPARATUS INCLUDING THE SAME

CROSS-REFERENCE TO RELATED APPLICATION

This application claims the benefit of Korean Patent Application No. 10-2015-0141820 filed on Oct. 8, 2015, and Korean Patent Application No. 10-2016-0046501 filed on Apr. 15, 2016, in the Korean Intellectual Property Office, the disclosures of which are incorporated herein by reference in their entirety.

BACKGROUND

1. Field

Apparatuses and methods consistent with exemplary embodiments relate to edge light emitting light sources of multiple wavelengths having a single chip structure, three-dimensional (3D) image obtaining apparatuses, and methods of manufacturing edge emitting laser light sources.

2. Description of the Related Art

A three-dimensional (3D) camera may measure distances from points on a surface of an object to the 3D camera. Various algorithms for measuring a distance between an object and a 3D camera have been suggested, and a time-of-flight (TOF) method is mainly used. The TOF method is a method of emitting illumination light (e.g., infrared ray) onto an object and measuring a flight time of the illumination light reflected from the object until a light receiver receives the reflected light. The flight time of the illumination light may be obtained by measuring a phase delay of the illumination light, and a high speed optical modulator may be used to accurately measure the phase delay. A distance image is extracted from the flight time of the light returning back after being reflected by the object.

SUMMARY

One or more exemplary embodiments provide edge emitting laser light sources emitting light of multiple wavelength bands with a single chip structure.

Further, one or more exemplary embodiments provide three-dimensional (3D) image obtaining apparatuses including an edge emitting laser light source capable of emitting light of multiple wavelength bands with a single chip structure.

According to an aspect of an embodiment, there is provided an edge emitting laser light source including: a substrate; an active layer disposed on the substrate; a wavelength selection section including grating regions configured to select wavelengths of light emitted from the active layer; and a gain section configured to resonate the light having the selected wavelengths in a direction parallel with the active layer.

The grating regions may be disposed at least one of between the active layer and the gain section and between the substrate and the active layer.

The grating regions may be arranged in a direction parallel with a light emitting direction from the gain section.

The grating regions may be arranged in parallel with the substrate.

The grating regions may be disposed outside the gain section.

The gain section may include a light emitting surface and a reflective surface, and the grating regions may be on at least one of a front portion of the light emitting surface and a rear portion of the reflective surface.

The grating regions may be arranged in parallel with the light emitting direction from the gain section.

The grating regions may be arranged in parallel with the substrate.

The grating regions may be configured to select light of different wavelengths according to grating array structures of the grating regions.

The grating regions may be disposed on the same substrate.

The edge emitting laser light source may have an integrated single chip structure.

The active layer may have a multi-quantum well structure.

The grating regions may include a material including at least one of In, Ga, As, and P.

The grating regions may include a combination of a dielectric material including at least one of $SiO_2$, SiNx, $TiO_2$, $MgF_2$, $Al_2O_3$, and $Ta_2O_5$, a polymer, and metal.

The wavelengths selected by the grating regions may range from 780 nm to 1650 nm.

The substrate may include a GaAs substrate.

The edge emitting laser light source may further include: a first type clad layer disposed between the substrate and the active layer; and a second type clad layer disposed on the active layer.

According to an aspect of another embodiment, there is provided a 3D image obtaining apparatus including: an edge emitting laser light source configured to emit light of multiple wavelength bands; an optical modulator configured to modulate the light emitted from the edge emitting laser light source and reflected by an object; and an image sensor configured to sense the light modulated by the optical modulator, wherein the edge emitting laser light source includes a substrate; an active layer disposed on the substrate; a wavelength selection section including a grating regions configured to select wavelengths of light emitted from the active layer; and a gain section configured to resonate the light having the selected wavelengths in a direction parallel with the active layer.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
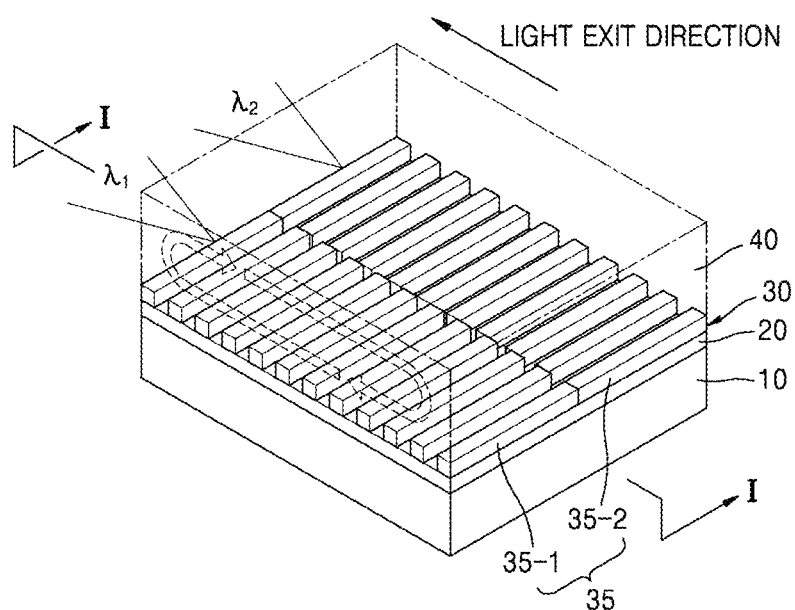
FIG. 1 is a schematic perspective view of an edge emitting laser light source according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

It will be understood that although the terms "first", "second", etc. may be used herein to describe various components, these components should not be limited by these terms. These terms are only used to distinguish one element from another.

As used herein, the singular forms "a," "an" and "the" are intended to include the plural forms as well, unless the context clearly indicates otherwise. It will be further understood that the terms "comprises," "comprising," "includes," and/or "including used herein specify the presence of stated features or elements, but do not preclude the presence or addition of one or more other features or elements.

In the present disclosure, terms such as units or modules are used to denote a unit having at least one function or performing at least one operation and implemented with hardware, software, or a combination of hardware and software. In addition, expressions such as "A is provided on B" may be construed that A is provided to B in a contact or non-contact manner. As used herein, the term "and/or" includes any and all combinations of one or more of the associated listed items. Expressions such as "at least one of," when preceding a list of elements, modify the entire list of elements and do not modify the individual elements of the list.

Figure 2:
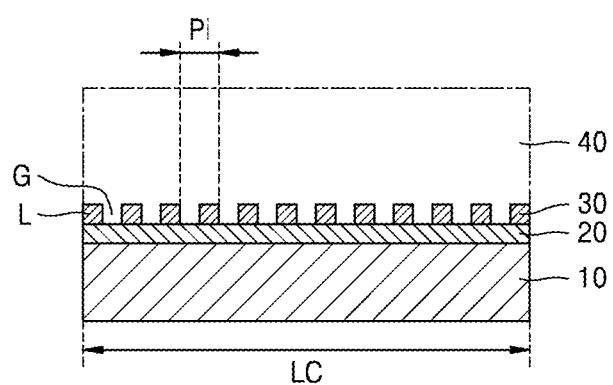
FIG. 2 is a cross-sectional view of the edge emitting laser light source taken along a line I-I of FIG. 1.

FIG. 1 is a perspective view of an edge emitting laser light source according to an exemplary embodiment, and FIG. 2 is a cross-sectional view of the edge emitting laser light source taken along a line I-I of FIG. 1.

The edge emitting laser light source may include a substrate 10, an active layer 20 on the substrate 10, a wavelength selection section 30 including a plurality of grating regions 35, and a gain section 40 resonating light having multiple wavelength bands selected by the plurality of grating regions 35.

The substrate 10 may be a GaAs substrate. The active layer 20 may include a material including at least one of In, Ga, As, and P, e.g., GaAs material. The active layer 20 may include a quantum well structure. For example, the active layer 20 may include a single quantum well or a multiple quantum well including a quantum well that is strained (compressed) and a tensile barrier layer. The well structure may include a single or multiple quantum well structure including a GaInN quantum well and an AlGaInN barrier layer, but is not limited thereto. That is, the material forming the active layer 20 may be variously changed depending on a desired oscillating wavelength band.

The plurality of grating regions 35 may be disposed at least one of between the active layer 20 and the gain section 40, and between the substrate 10 and the active layer 20.

The plurality of grating regions 35 may each include a grating array structure that is different from those of the others. The plurality of grating regions 35 may select the wavelength bands of their own according to the grating array structures therein. Therefore, the plurality of grating regions 35 may oscillate light of multiple wavelength bands. For example, light of a certain wavelength constructively interferes and light of another wavelength destructively interferes according to a structure of arranging gratings and a size of gratings, in order to select the wavelength band. The structure of arranging the gratings may include, for example, pitches between the gratings, and a direction in which the gratings are arranged. The size of the gratings may include, for example, depths of the grating and widths of the gratings.

The grating region 35 may include a combination of one or more materials including a compound including at least one of In Ga, Al, As, and P, a dielectric material including at least one of $SiO_2$, $SiN_x$, $TiO_2$, $MgF_2$, $Al_2O_3$, and $Ta_2O_5$, polymer, and metal. For example, the dielectric material may include $SiO_2/SiNx$, $Al_2O_3/TiO_2$, $Al_2O_3/SiNx$, and $SiO_2/Ta_2O_5$.

In the edge emitting laser light source according to the embodiment, the grating region 35 may cause an incident light to oscillate among multiple wavelength bands, and may have a single chip structure of an integrated type. The single chip structure of an integrated type does not include an adhesive layer for bonding or a seam formed as a result of the bonding, and the plurality of grating regions 35 may be provided on one substrate 10.

The gain section 40 may resonate and amplify the light having the selected multiple wavelength bands. The gain section 40 may resonate the light by reflecting the light back and forth in a direction parallel with the active layer 20.

The wavelength selection section 30 may be above or under the active layer 20, and on a light exiting surface or a surface opposite to the light exiting surface with respect to the light exit direction. In FIG. 1, the wavelength selection section 30 is, for example, on the active layer 20, but is not limited thereto.

The plurality of grating regions 35 may include, for example, a first grating region 35-1 and a second grating region 35-2. However, the number of grating regions is not limited thereto. The first and second grating regions 35-1 and 35-2 may function as distributed feedbacks. For example, the first grating region 35-1 may selectively reflect light of a first wavelength band ($\lambda 1$) and the second grating region 35-2 may selectively reflect light of a second wavelength band ($\lambda 2$).

In the edge emitting laser light source of multiple wavelengths shown in FIGS. 1 and 2, a resonant space in which the light of the selected wavelength band resonates may be referred to as, for example, a laser cavity. A width LC of the laser cavity may be equal to or less than 1 mm, for example. However, the width LC of the laser cavity is not limited to the above example, and may be variously designed.

Figure 3:
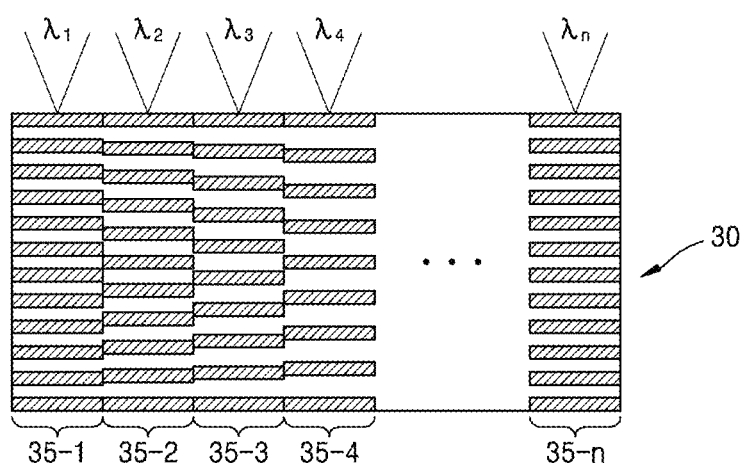
FIG. 3 is a diagram illustrating an example in which the edge emitting laser light source of FIG. 1 includes a grating region of three or more wavelength bands.

FIG. 3 is a diagram of an example in which the plurality of grating regions 35 in the edge emitting laser light source of FIG. 1 emit light of two or more different wavelength bands.

The plurality of grating regions 35 may include the first grating region 35-1, the second grating region 35-2, a third grating region 35-3, ..., and an n-th grating region 35-n. The first to n-th grating regions 35-1 to 35-n may respectively select light of different wavelength bands from each other, or some of the plurality of grating regions 35 may select light of the same wavelength bands as each other. The first to n-th grating regions 35-1 to 35-n may be arranged in parallel with the light exiting direction. The first to n-th grating regions 35-1 to 35-n may select the wavelength bands according to an arranging period of the gratings and sizes of the gratings.

For example, each of the first to n-th grating regions 35-1 to 35-n may include lands L and grooves G that are alternately arranged with each other, as shown in FIG. 2. The arrangement period of the gratings may be, for example, a pitch Pi between two adjacent lands L (or grooves G). In addition, the size of the grating may vary depending on, for example, a height, a width, and/or a length of the land L (or groove G). In each grating region, the light exit direction may be in parallel with a direction in which the gratings are arranged. That is, the light exit direction may be a side direction of the edge emitting laser light source.

For example, the first grating region 35-1 may select light of the first wavelength band ($\lambda 1$), the second grating region 35-2 may select light of the second wavelength band ($\lambda 2$), and the n-th grating region 35-n may select light of an n-th wavelength band ($\lambda n$) and then reflect the light.

The light of the wavelength band selected by each grating region may resonate while reciprocating in the gain section 40. Reflection regions may be formed on opposite side surfaces of the gain section 40.

The edge emitting laser light source according to the exemplary embodiment may have a single chip structure of an integrated type, in which the plurality of grating regions configured to emit light of the plurality of wavelength bands are arranged as an array structure. The single chip structure does not have an attaching layer for bonding process, or a seam resulting from the bonding process, and may denote a structure in which the edge emitting laser light source is manufactured on a single substrate without bonding process or the seam.

The edge emitting laser light source according to the exemplary embodiment may be used, for example, for obtaining 3D images. In order to obtain a 3D image, information about a distance (or depth) to an object is necessary, and an optical modulator having excellent electrical-optical characteristics may be used to obtain a 3D image having a high distance (or depth) accuracy. However, if there is a large difference between characteristic variations of a light source and the optical modulator according to temperature variation, the distance (or depth) accuracy may degrade. Hereinafter, the characteristic variations of the light source and the optical modulator according to the temperature variation will be described below.

Figure 4:
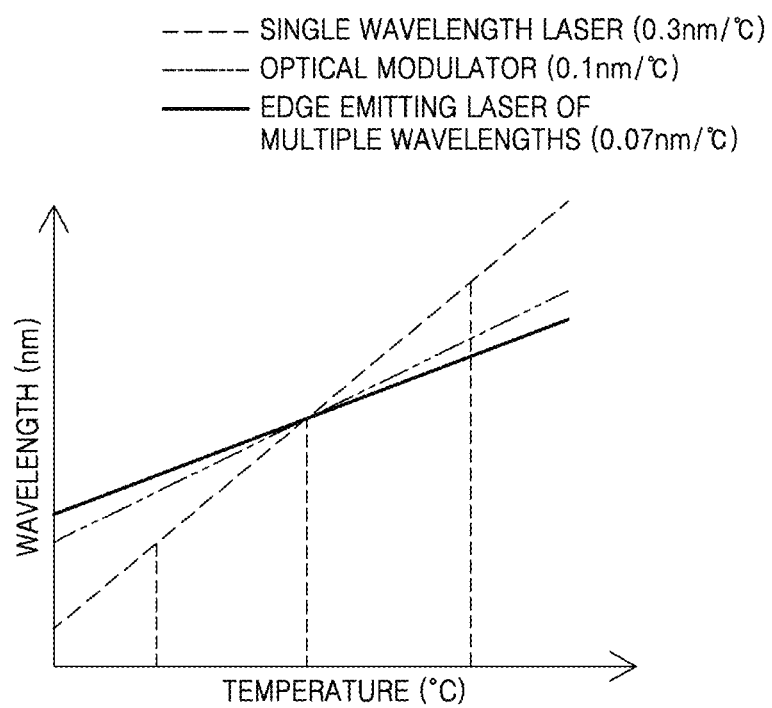
FIG. 4 is a graph showing variation in wavelength versus temperatures of the edge emitting laser light source, an optical modulator, and an edge emitting laser light source of a single wavelength.

FIG. 4 is a graph showing variation in wavelength versus temperature. The horizontal axis of the graph denotes temperature, and the longitudinal axis of the graph denotes wavelength. Since the graph shows a tendency of the characteristic variation, units are omitted. The edge emitting laser light source of a single wavelength shows variation in wavelength of about 0.3 nm/° C. according to the temperature variation. The optical modulator shows variation in wavelength of about 0.1 nm/° C. according to the temperature variation. The edge emitting laser light source of multiple wavelengths according to the exemplary embodiment shows variation in wavelength of about 0.07 nm/° C. according to the temperature variation. According to the above results, the difference between the wavelength variations of the edge emitting laser light source of a single wavelength and the optical modulator according to the temperature variation may be about 0.2 nm/° C. On the other hand, the difference between the wavelength variations of the edge emitting laser light source of multiple wavelengths according to the exemplary embodiment and the optical modulator according to the temperature variation may be about 0.03 nm/° C. Therefore, the edge emitting laser light source of multiple wavelengths according to the exemplary embodiment has a temperature characteristic that is relatively similar to that of the optical modulator, compared with the light source of a single wavelength, and thus, a high distance (or depth) accuracy with respect to the peripheral temperature variation may be obtained.

Figure 5:
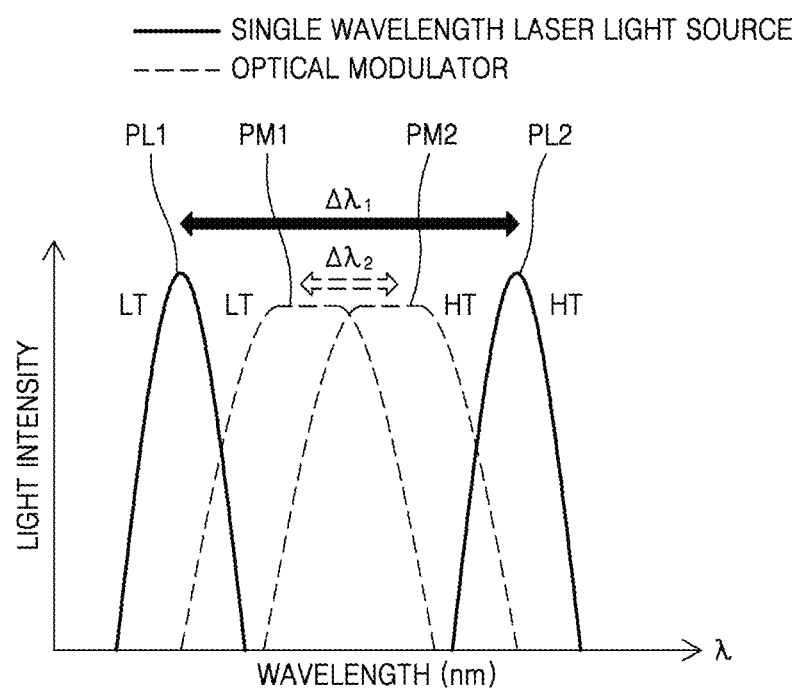
FIG. 5 is a graph showing variation in light intensity of an optical modulator and an edge emitting laser light source according to wavelengths, with respect to a relatively high temperature and a relatively low temperature.

FIG. 5 is a graph showing a light intensity of the edge emitting laser light source of a single wavelength according to wavelength, compared with a light intensity of the optical modulator according to the wavelength. The optical intensities are shown with respect to a relatively high temperature HT and a relatively low temperature LT, and variations according to the temperature are compared with those of the optical modulator. In the graph, solid lines denote variations of the edge emitting laser light source of a single wavelength and dashed lines denote variations of the optical modulator.

A difference between the wavelengths of the edge emitting laser light source of a single wavelength at a first peak point PL1 with respect to the low temperature LT and a second peak point PL2 with respect to the high temperature HT is defined as Δλ1. A difference between the wavelengths of the optical modulator at a third peak point PM1 with respect to the low temperature LT and a fourth peak point PM2 with respect to the high temperature HT is defined as Δλ2.

Figure 6:
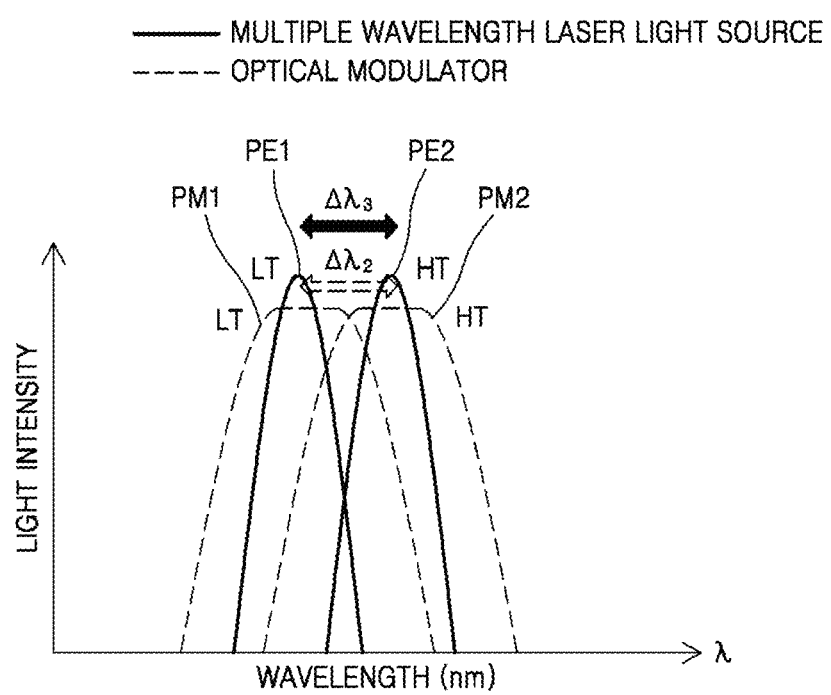
FIG. 6 is a graph showing variation in light intensity of an optical modulator and an edge emitting laser light source according to wavelengths, with respect to a relatively high temperature and a relatively low temperature.

FIG. 6 is a graph showing a light intensity of the edge emitting laser light source of multiple wavelengths according to the exemplary embodiment that varies according to the wavelength, compared with a light intensity of the optical modulator that varies according to the wavelength. The optical intensities are shown with respect to a relatively high temperature HT and a relatively low temperature LT, and variations according to the temperature are compared with those of the optical modulator. In the graph, solid lines denote variations of the edge emitting laser light source of multiple wavelengths according to the exemplary embodiment and dashed lines denote variations of the optical modulator. A difference between wavelengths of the edge emitting laser light source of multiple wavelengths according to the exemplary embodiment at a fifth peak point PE1 with respect to the low temperature LT and at a sixth peak point PE2 with respect to the high temperature HT is defined as Δλ3. As described above, the difference between the wavelengths of the optical modulator at the third peak point PM1 with respect to the low temperature LT and the fourth peak point PM2 with respect to the high temperature HT is Δλ2. When FIG. 5 is compared with FIG. 6, Δλ1 is greater than Δλ2, and Δλ2 and Δλ3 may be nearly equal to each other. That is, the edge emitting laser light source according to the exemplary embodiment may have light intensity variation according to the wavelength, wherein the light intensity variation is similar to that of the optical modulator.

The edge emitting laser light source according to the exemplary embodiment may have characteristics corresponding to the wavelength variation characteristic and the light intensity variation characteristic of the optical modulator with respect to the temperature variation. That is, the difference between the wavelength variations of the optical modulator and the light source with respect to the temperature variation may be reduced. Therefore, the characteristic variation of the optical modulator according to the temperature variation may be effectively compensated for, and the accuracy of a 3D distance sensor may be improved.

Figure 7:
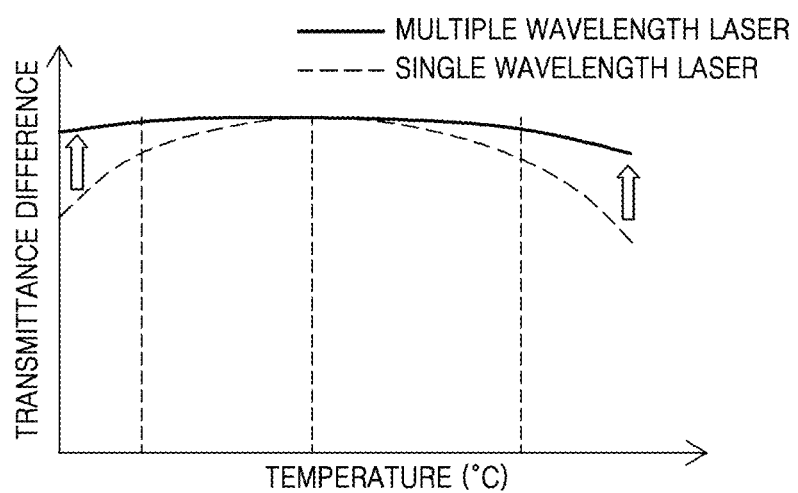
FIG. 7 is a graph showing a variation in a transmittance difference of an edge emitting laser light source and an edge emitting laser light source of a single wavelength, according to a temperature variation.

FIG. 7 is a graph showing a transmittance difference of the optical modulator according to temperature. The transmittance difference denotes a difference between a transmittance when a voltage is applied to the optical modulator and a transmittance when a voltage is not applied to the optical modulator. The transmittance when the voltage is not applied to the optical modulator may be greater than that when the voltage is applied to the optical modulator. As the transmittance difference increases, the accuracy of the 3D distance sensor is improved. Here, the temperature may denote a temperature around the optical modulator. In FIG. 7, a dashed line denotes the transmittance difference of the edge emitting laser light source of a single wavelength and a solid line denotes the transmittance difference of the edge emitting laser light source of multiple wavelengths according to the exemplary embodiment. According to the edge emitting laser light source of a single wavelength, the transmittance difference of the optical modulator varies depending on the temperature variation, whereas the transmittance difference of the optical modulator may be constant without regard to the temperature variation according to the edge emitting laser light source of multiple wavelengths according to the embodiment. When the transmittance difference of the optical modulator is maintained constant without regard to the temperature variation, the accuracy of the 3D distance sensor may be maintained constant without being affected by the temperature variation. If the transmittance difference of the optical modulator varies depending on the temperature variation, the optical modulator sensitively reacts with the temperature and the accuracy in the distance sensing may degrade.

The edge emitting laser light source according to the exemplary embodiment may emit light of a red wavelength band. For example, the edge emitting laser light source may emit light having a wavelength ranging from 780 nm to 1650 nm, in more detail, a wavelength ranging from 800 nm to 1600 nm.

Figure 8:
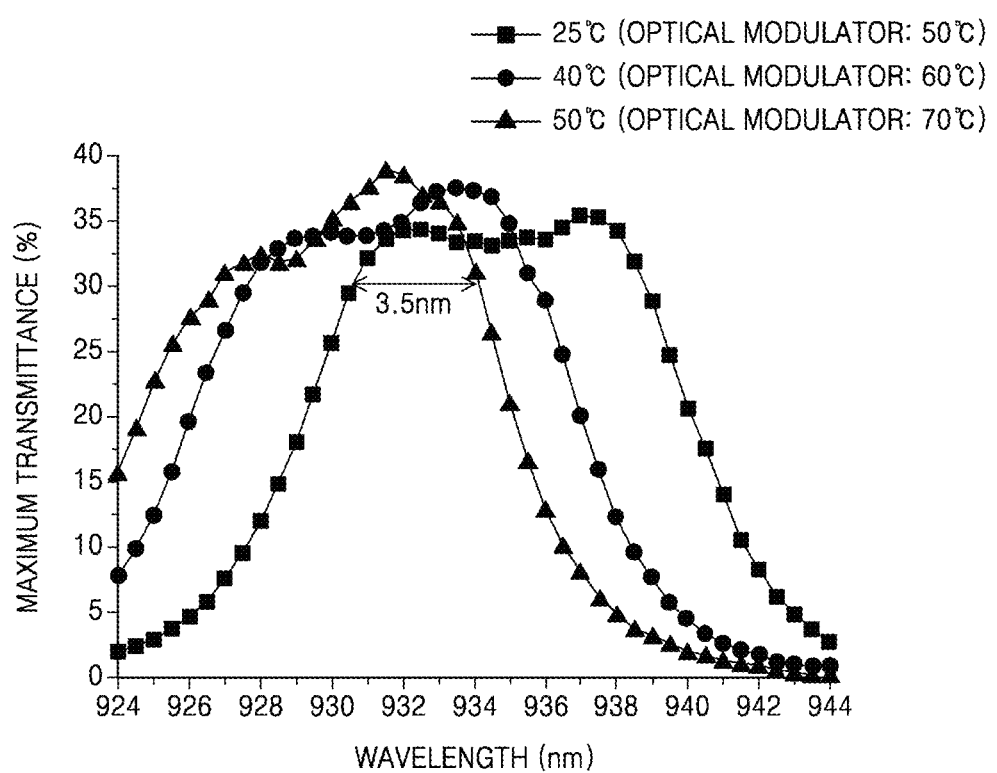
FIG. 8 is a graph showing variations in a transmittance difference of an optical modulator according to wavelengths of an edge emitting laser light source of a single wavelength, with respect to temperatures of 25° C., 40° C., and 50° C.
Figure 9:
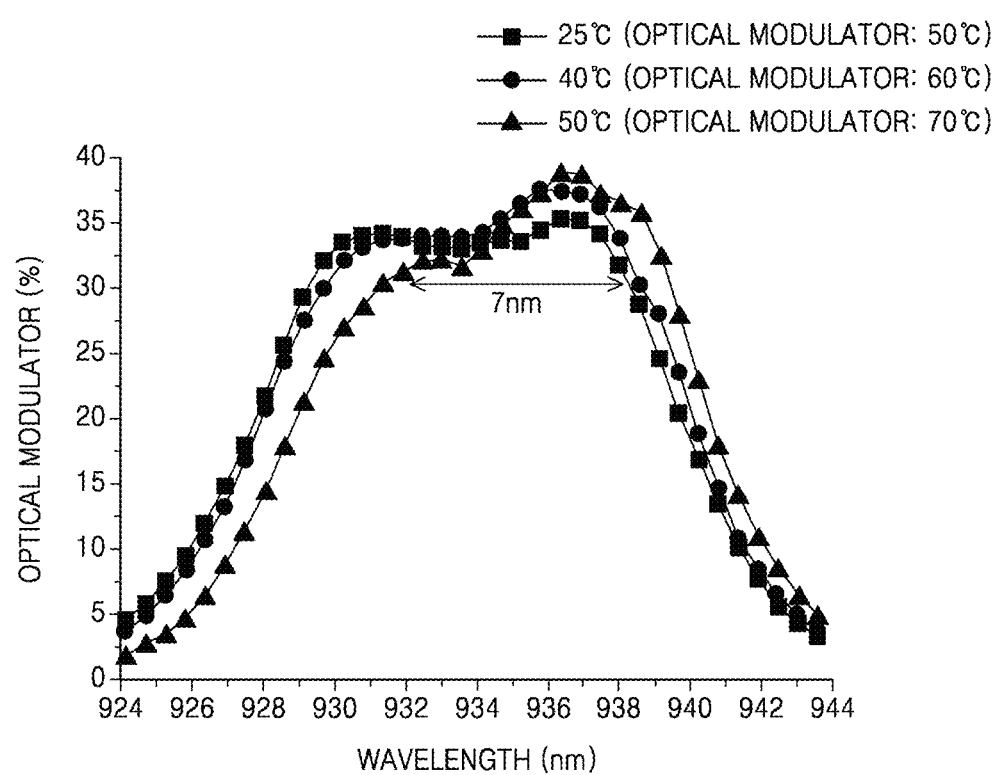
FIG. 9 is a graph showing variations in a transmittance difference of an optical modulator according to wavelengths of an edge emitting laser light source, with respect to temperatures of 25° C., 40° C., and 50° C.

FIG. 8 is a graph showing variations in maximum transmittance differences of the optical modulator according to the wavelengths in the edge emitting laser light source of a single wavelength, with respect to temperature variations. FIG. 8 shows the variations in the maximum transmittance difference of the optical modulator according to the wavelength, when an external temperature of the optical modulator is 25° C., 40° C., and 50° C. Since the optical modulator generates heat, the temperature of the optical modulator is generally higher than the external temperature. FIG. 8 shows that the temperature of the optical modulator is 50° C., 60° C., and 70° C. when the external temperature is 25° C., 40° C., and 50° C. When the maximum transmittance difference of the optical modulator is about 30% or greater, an excellent sensing efficiency in measuring the 3D distance may be ensured. Referring to FIG. 8, an overlapping wavelength band, in which the optical modulator may ensure the maximum transmittance difference of about 30% or greater without regard to the external temperature, is 3.5 nm. FIG. 9 is a graph showing variations in maximum transmittance differences of the optical modulator according to the wavelengths in the edge emitting laser light source of multiple wavelengths according to the exemplary embodiment, with respect to temperature variations. Referring to FIG. 9, an overlapping wavelength band corresponding to the transmittance difference of about 30% with respect to the external temperatures of 25° C., 40° C., and 50° C. may be 7 nm. As the overlapping wavelength band, in which a predetermined transmittance difference may be ensured with respect to a possible external temperature range of the optical modulator, increases, the difference between the light transmittance characteristics of the light source and the optical modulator according to the temperature variation decreases, and as the difference between the light transmittance characteristics according to the temperature variation decreases, the accuracy in sensing a distance may be improved.

Figure 10:
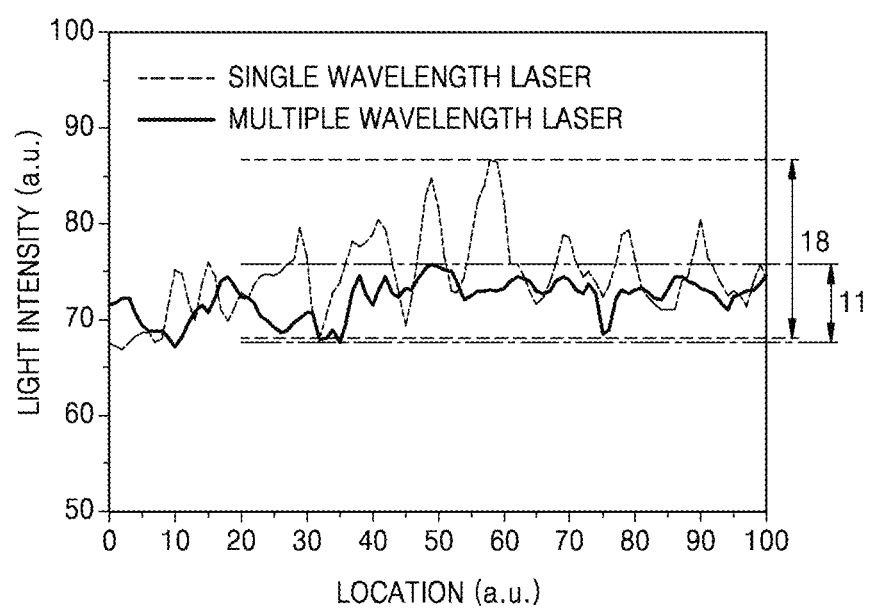
FIG. 10 is a graph showing variations in light intensities of an edge emitting laser light source and an edge emitting laser light source of a single wavelength, according to locations of an object.
Figure 11:
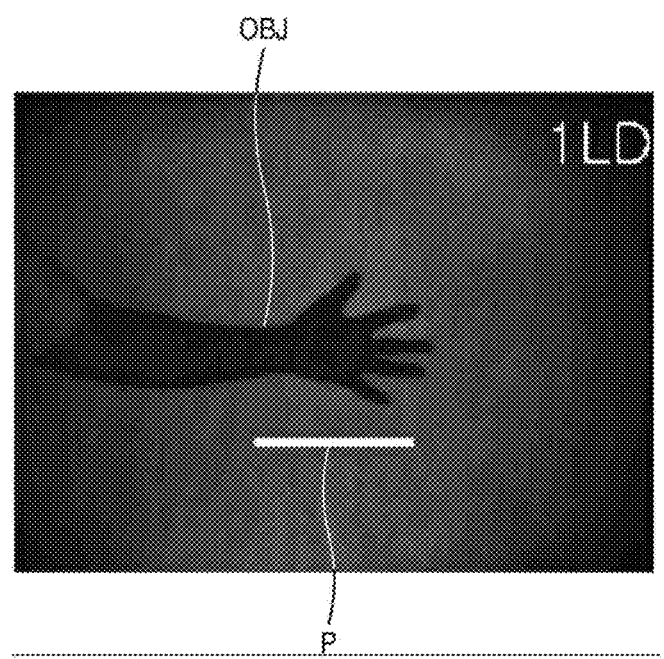
FIG. 11 is a diagram showing an image formed by an edge emitting laser light source.
Figure 12:
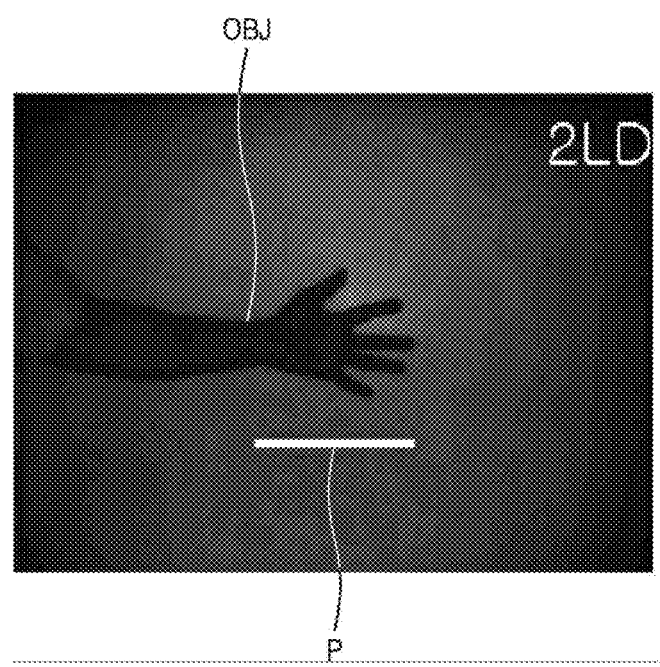
FIG. 12 is a diagram showing an image formed by an edge emitting laser light source of a single wavelength.

FIG. 10 is a graph showing fluctuation patterns of the edge emitting laser light source of a single wavelength and the edge emitting laser light source of multiple wavelengths with respect to a location of illumination. For example, FIG. 11 is an image obtained by photographing an object OBJ by using light emitted from the edge emitting laser light source of a single wavelength, and FIG. 12 is an image obtained by photographing an object OBJ by using light emitted from the edge emitting laser light source of multiple wavelengths. FIG. 10 shows a light intensity measured at a predetermined location P of the image of the object OBJ, and expressed in an arbitrary unit (a.u.). In FIG. 10, a dashed line denotes the pattern of the edge emitting laser light source of a single wavelength, and a solid line denotes the pattern of the edge emitting laser light source of multiple wavelengths. For example, a maximum amplitude in the fluctuation pattern of the edge emitting laser light source of a single wavelength may be 18, and a maximum amplitude in the fluctuation pattern of the edge emitting laser light source of multiple wavelengths may be 11. As described above, the amplitude in the fluctuation pattern of the edge emitting laser light source of multiple wavelengths may be less than that of the edge emitting laser light source of a single wavelength. When the amplitude of the fluctuation pattern is reduced, a speckle of the laser may be reduced.

The edge emitting laser light source according to the exemplary embodiment is configured to have multiple wavelength bands with a single chip structure, and thus, the light source may be miniaturized, unevenness in each wavelength band may be reduced, and manufacturing costs may be reduced.

Figure 13:
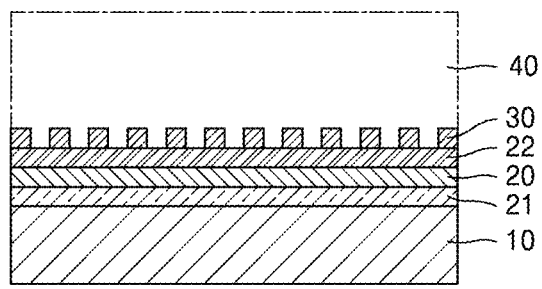
FIG. 13 is a diagram of the edge emitting laser light source of FIG. 1, further including a clad layer.

FIG. 13 is a cross-sectional view of the edge emitting laser light source of FIG. 1, further including a clad layer. Detailed descriptions of the elements denoted by the same reference numerals as those of FIG. 1 are omitted. For example, a first type clad layer 21 may be disposed on a surface of the active layer 20, and a second type clad layer 22 may be disposed on another surface of the active layer 20. The first type clad layer 21 may be, for example, an n-type clad layer, and the second type clad layer 22 may be, for example, a p-type clad layer, or vice versa.

The n-type clad layer and the p-type clad layer may include, for example, bulk crystals of GaN, AlGaN, or AlGaInN, or a superlattice structure of AlGaN/AlGaN or AlGaN/GaN. However, one or more exemplary embodiments are not limited thereto, and the n-type clad layer and the p-type clad layer may include various materials. The first type clad layer 21 and the second type clad layer 22 may improve an optical efficiency by improving an optical confinement effect.

Figure 14:
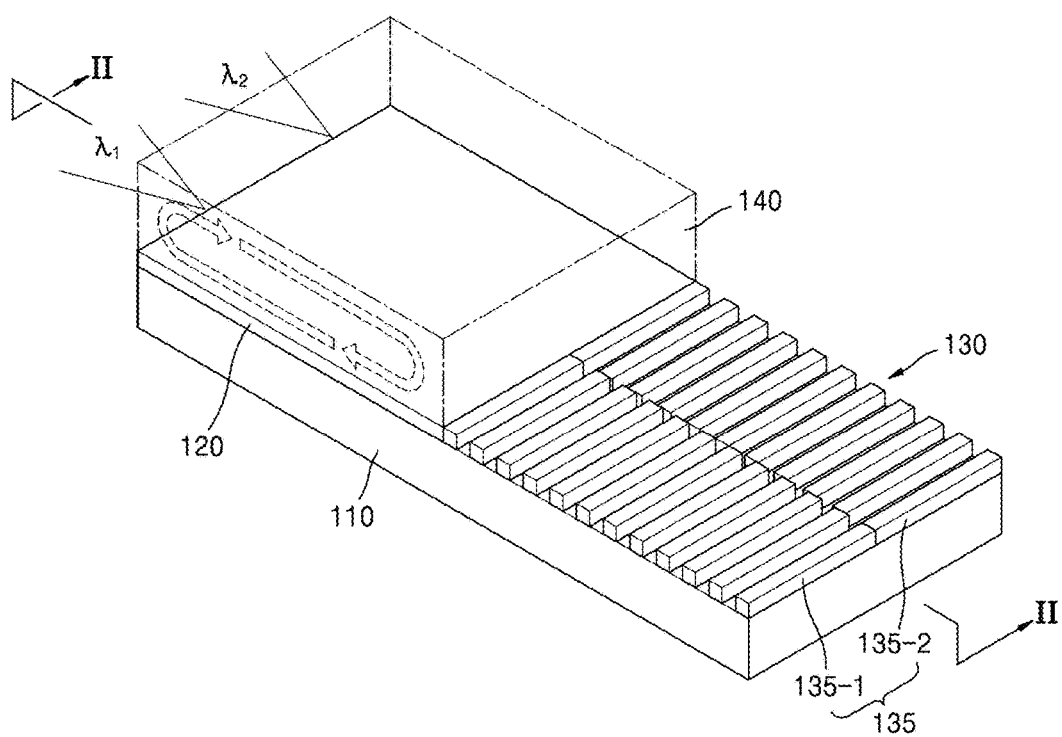
FIG. 14 is a schematic perspective view of an edge emitting laser light source according to an exemplary embodiment.
Figure 15:
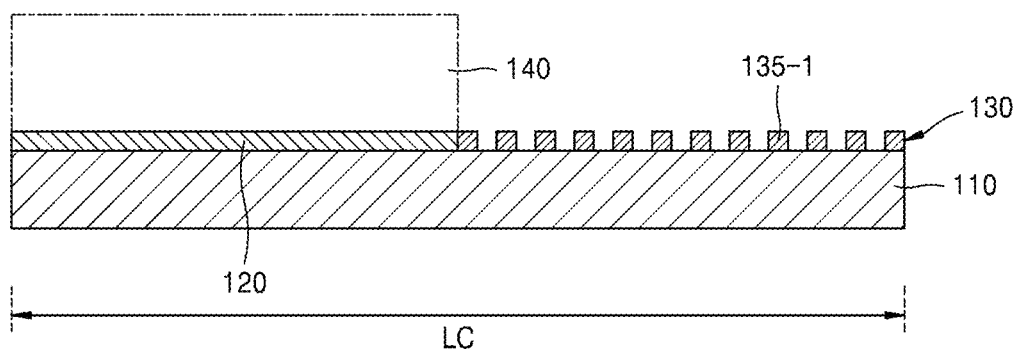
FIG. 15 is a cross-sectional view of the edge emitting laser light source taken along a line II-II of FIG. 14.

FIG. 14 is a perspective view of an edge emitting laser light source according to an exemplary embodiment, and FIG. 15 is a cross-sectional view of the edge emitting laser light source taken along a line II-II of FIG. 14. The edge emitting laser light source may include the substrate 110, the active layer 120 on the substrate 110, the wavelength selection section 130 including a plurality of grating regions 135, and the gain section 140 for resonating light having multiple wavelength bands selected by the plurality of grating regions 135. The wavelength selection section 130 may be arranged in parallel with a side surface of the active layer 120. That is, the active layer 120 is disposed on a part of the substrate 110, and the wavelength selection section 130 may be disposed on a remaining part of the substrate 110. The gain section 140 may be on the active layer 120.

The plurality of grating regions 135 may be disposed outside the gain section 140. For example, the gain section 140 includes a light emitting surface and a reflective surface, and the plurality of grating regions 135 may be disposed on at least one of a front and a rear portion of the light emitting surface.

The plurality of grating regions 135 may include, for example, the first grating region 135-1 and the second grating region 135-2. The wavelength selection section 130 may function as, for example, a distributed Bragg reflector.

For example, light of a certain wavelength constructively interferes and light of another wavelength destructively interferes according to an arrangement of the plurality of grating regions 135 and sizes of the gratings, and then, the wavelength band may be selected. The arrangement of the gratings may include, for example, a pitch between gratings, and a direction of arranging the gratings. The size of the gratings may include, for example, a depth of the grating and a width of the grating. The gain section 140 may resonate the light of the selected multiple wavelength bands to amplify the light. The gain section 140 may emit the amplified light by reflecting the light back and forth in a direction parallel with the active layer 120.

In the edge emitting laser light source of multiple wavelengths shown in FIG. 15, a width LC of the laser cavity may be, for example, 2 mm or less, but is not limited thereto, that is, the width of the laser cavity may be variously designed.

The edge emitting laser light source of a distributed feedback laser (DBR) type shown in FIG. 14 is configured to have multiple wavelength bands with an integrated type single chip structure, and thus, may be miniaturized. In addition, unevenness between the characteristics of the multiple wavelength bands may be reduced and manufacturing costs of the edge emitting laser light source may be reduced. In addition, compared to the edge emitting laser light source of a single wavelength, the variation in the wavelength according to the temperature variation of the optical modulator is relatively smaller, and thus, the efficiency and accuracy of a 3D distance sensor may be improved. Also, the edge emitting laser light source shows high output and high efficiency characteristics, and selectivity with respect to the wavelength is relatively high due to the application of the gratings, and thus, the edge emitting laser light source may be effectively applied to a 3D distance sensor.

Figure 16:
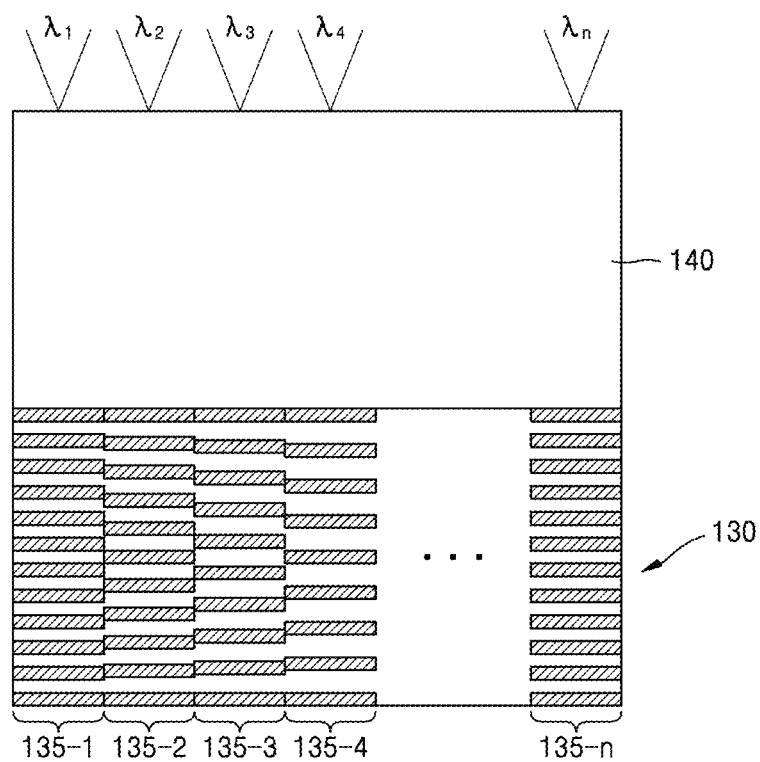
FIG. 16 is a diagram illustrating an example in which the edge emitting laser light source of FIG. 14 includes a grating region of three or more wavelength bands.

In FIG. 14, there are two grating regions, but three or more grating regions may be provided as shown in FIG. 16, and the grating regions may be variously designed depending on a desired wavelength band. In FIG. 16, the wavelength selection section 130 may include the first grating region 135-1, the second grating region 135-2, a third grating region 135-3, a fourth grating region 135-4, . . . , and an n-th grating region 135-$n$. For example, the first grating region 135-1 selects light of a first wavelength $\lambda 1$, the second grating region 135-2 may select light of a second wavelength $\lambda 2$, and the n-th grating region 135-$n$ may select light of an n-th wavelength $\lambda n$ and reflect the selected light.

Figure 17:
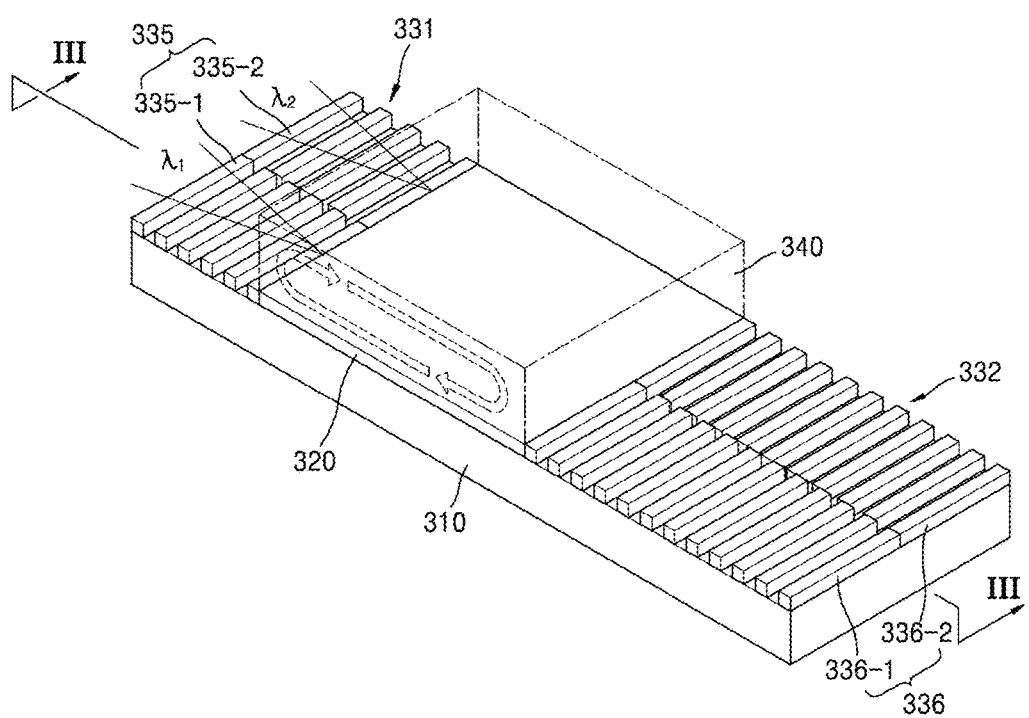
FIG. 17 is a schematic perspective view of an edge emitting laser light source according to an exemplary embodiment.
Figure 18:
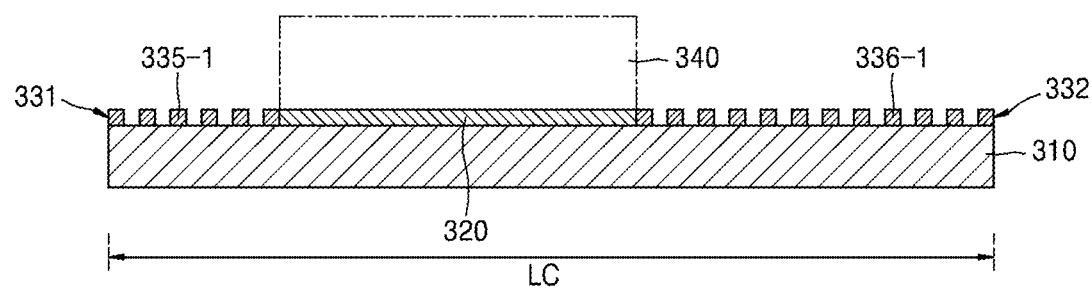
FIG. 18 is a cross-sectional view of the edge emitting laser light source taken along a line III-III of FIG. 17.

Next, FIG. 17 is a perspective view of an edge emitting laser light source according to an embodiment, and FIG. 18 is a cross-sectional view of the edge emitting laser light source taken along a line III-III of FIG. 17.

The edge emitting laser light source may include a substrate 310, an active layer 320 disposed on the substrate 310, a plurality of wavelength selection sections 331 and 332 including a plurality of grating regions 335 and 336, and a gain section 340 for resonating light of multiple wavelength bands selected by the plurality of grating regions 335 and 336.

For example, the plurality of wavelength selection sections 331 and 332 may be arranged in parallel with side surfaces of the active layer 320. For example, a first wavelength selection section 331 may be disposed at a first side of the active layer 320, and a second wavelength selection section 332 may be disposed at a second side of the active layer 320 that opposes the first side of the active layer 320. The gain section 340 may be arranged on the active layer 320.

The first wavelength selection section 331 and the second wavelength selection section 332 may include a plurality of grating regions 335 and 336 corresponding to each other. For example, the first wavelength selection section 331 may include a first grating region 335-1 configured to select the first wavelength band $\lambda 1$ and a second grating region 335-2 configured to select the second wavelength band λ2. The second wavelength selection section 332 may include a third grating region 336-1 and a fourth grating region 336-2.

For example, the third grating region 336-1 may have a grating array structure that is substantially the same as the first grating region 335-1. The fourth grating region 336-2 may have a grating array structure that is the same as the second grating region 335-2. For example, the third grating region 336-1 may have a length that is less than that of the first grating region 335-1. The fourth grating region 336-2 may have a length that is less than that of the second grating region 335-2. However, one or more exemplary embodiments are not limited thereto, that is, the length of the grating regions may be variously selected.

The light of the first wavelength band λ1 may be selected by the first grating region 335-1 and the third grating region 336-1, and the light of the second wavelength band λ2 may be selected by the second grating region 335-2 and the fourth grating region 336-2.

In the edge emitting laser light source of multiple wavelengths shown in FIG. 18, the width LC of the laser cavity may be, for example, 2.5 mm or less, but is not limited thereto. That is, the width of the laser cavity may be variously designed.

Figure 19:
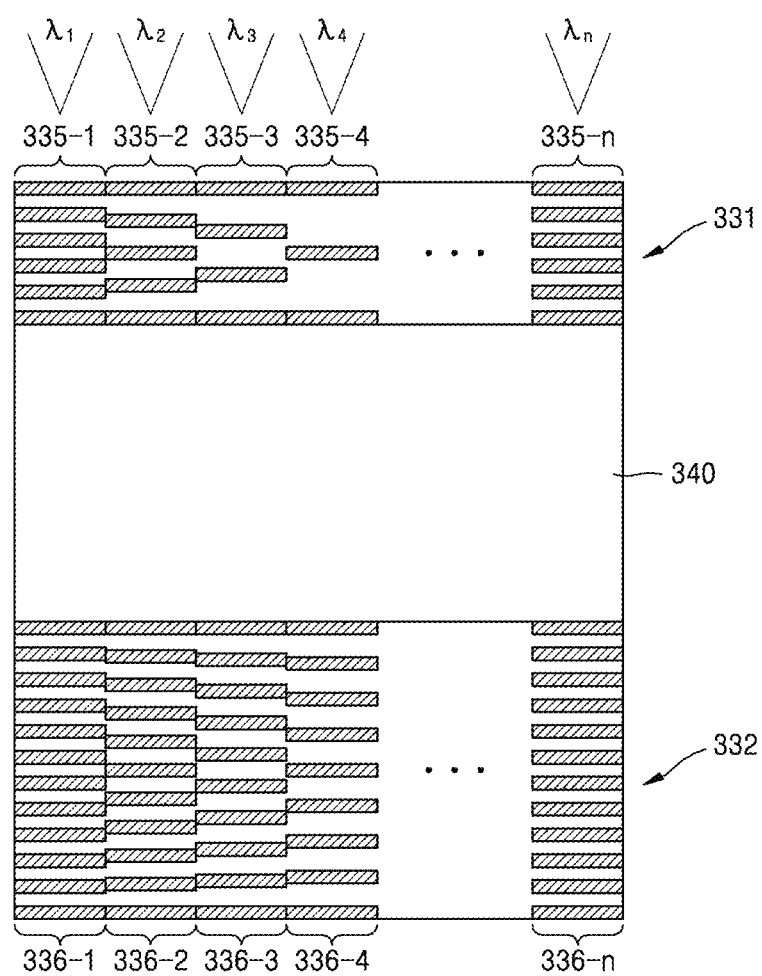
FIG. 19 is a diagram illustrating an example in which the edge emitting laser light source of FIG. 17 includes a grating region of three or more wavelength bands.

As shown in FIG. 19, each of the wavelength selection sections may include three or more grating regions. For example, each wavelength selection section may include grating regions 335-1, 335-2, . . . , 335-n, and the grating regions may be variously designed according to a desired selection wavelength band.

The first wavelength selection section 331 may include a 1-1 grating region 335-1, a 1-2 grating region 335-2, a 1-3 grating region 335-3, a 1-4 grating region 335-2, . . . , and a 1-n grating region 335-n. The second wavelength selection section 332 may include a 2-1 grating region 336-1, a 2-2 grating region 336-2, a 2-3 grating region 336-3, a 2-4 grating region 336-4, . . . , and a 2-n grating region 336-n.

For example, the 1-1 grating region 335-1 and the 2-1 grating region 336-1 may select light of the first wavelength λ1, the 1-2 grating region 335-2 and the 2-2 grating region 336-2 may select light of the second wavelength λ2, and the 1-n grating region 335-n and the 2-n grating region 336-n may select light of the n-th wavelength λn and reflect the light.

A first type clad layer may be further disposed on a surface of the active layer 320, and a second type clad layer may be further disposed on the other surface of the active layer 320.

Figure 20:
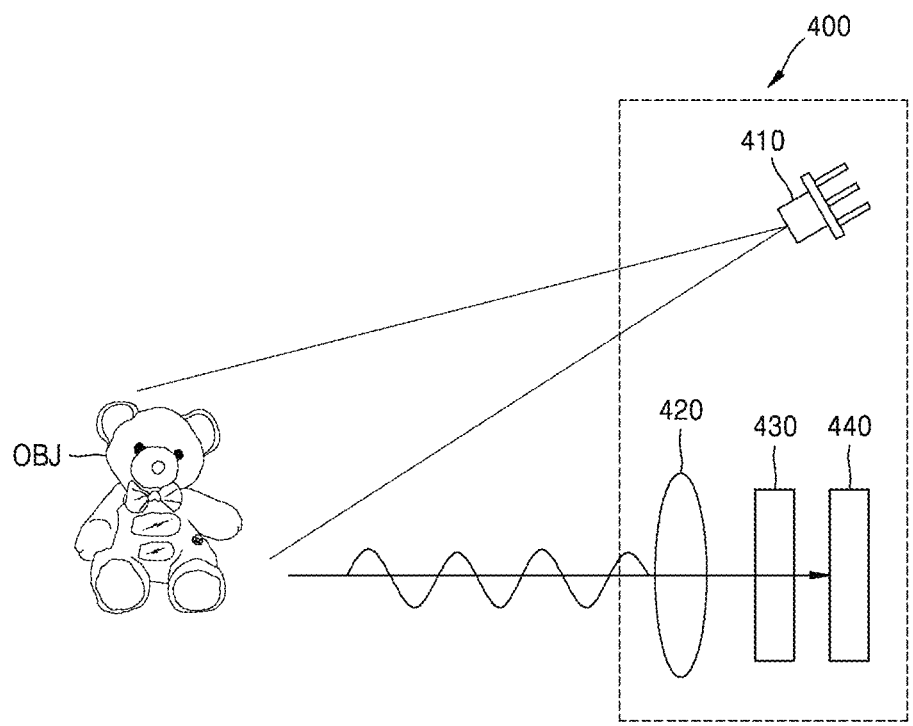
FIG. 20 is a schematic diagram of a three-dimensional (3D) image obtaining apparatus according to an exemplary embodiment.

FIG. 20 is a schematic diagram of a 3D image obtaining apparatus 400 according to an exemplary embodiment. The 3D image obtaining apparatus 400 may include a light source 410 emitting light to an object OBJ, a light modulator 430 modulating light reflected by the object OBJ, and an image sensor 440 receiving light modulated by the light modulator 430 to form an image.

The light source 410 may be the edge emitting laser light source of multiple wavelengths described above with reference to FIGS. 1 to 19. The light source 410 may include a red laser light source of multiple wavelengths having an integrated type single chip structure. A red wavelength band may range, for example, from 780 nm to 1650 nm. The red wavelength band may range, in greater detail, from 800 nm to 1600 nm. The light modulator 430 may have a transmissive type and thus may modulate the amplitude or phase of the light reflected by the object OBJ. At least one lens 420 may be further disposed between the light source 410 and the light modulator 430 for condensing light.

The edge emitting laser light source 410 may emit multiple wavelength laser of the single chip structure to the object OBJ. As such, the difference between the variation in the characteristic of the light source 410 and the variation in the characteristic of the optical modulator 430 according to the temperature variation may be reduced. When the difference between the variations in the characteristics of the light source 410 and the optical modulator 430 with respect to the external environment is reduced, the accuracy in measuring the distance (depth) to the object OBJ may be improved. In addition, speckles are reduced, and accordingly, image quality of the 3D image obtaining apparatus may be improved.

Figure 21:
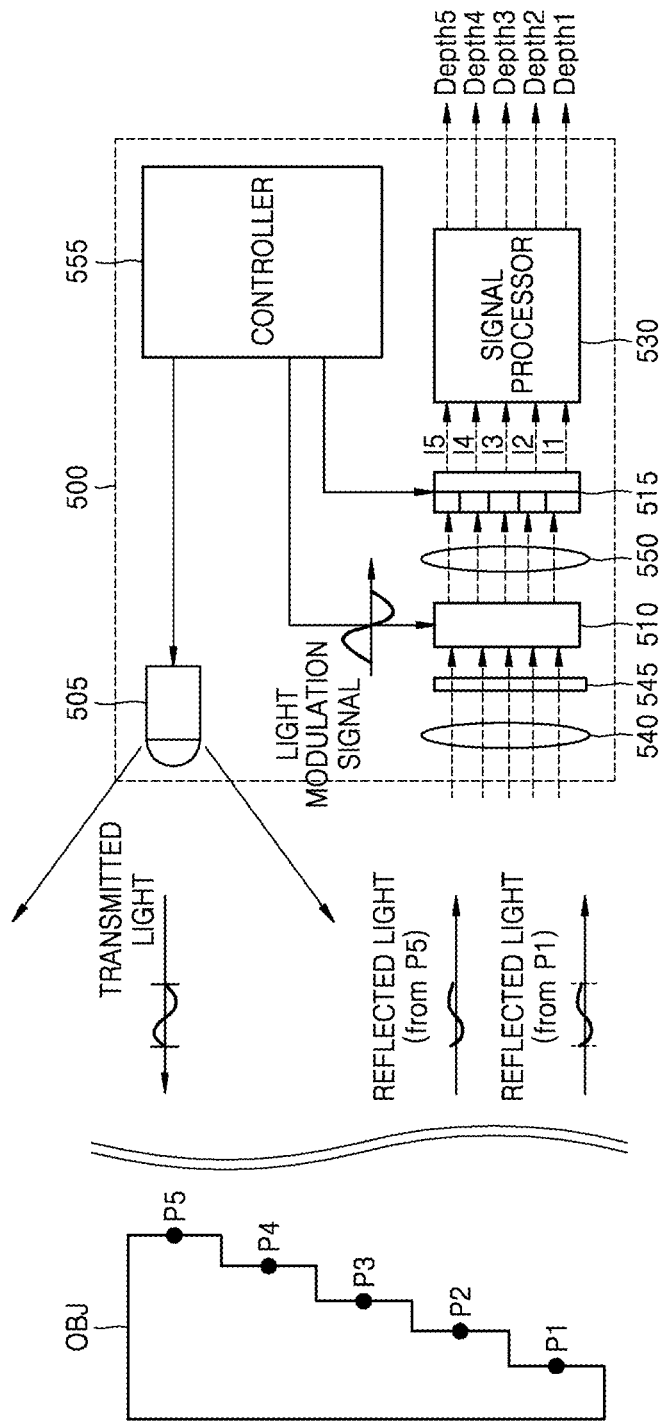
FIG. 21 is a schematic diagram of a 3D image obtaining apparatus according to an exemplary embodiment.

FIG. 21 is a schematic diagram of a 3D image obtaining apparatus 500 according to an embodiment.

The 3D image obtaining apparatus 500 may be configured, for example, to extract depth information of the object OBJ by using a time of flight (TOF) method.

The 3D image obtaining apparatus 500 may include an edge emitting laser light source 505 emitting light of multiple wavelength bands to an object OBJ, an optical modulator 510 modulating light reflected by the object OBJ, an image sensor 515 sensing the light modulated by the optical modulator 510 and converting the sensed light into electric signals, and a signal processor 530 calculating depth image information from an output from the image sensor 515. In addition, the 3D image obtaining apparatus 500 may further include a controller 555 for controlling operations of the light source 505, the optical modulator 510, the image sensor 515, and the signal processor 530. The controller 555 may be implemented by a processor integrating both of the controller 555 and the signal processor 530. Alternatively, the controller 555 may be implemented by a processor separately provided from the signal processor 530. The light source 505 may be the light source described above with reference to FIGS. 1 to 19.

The 3D image obtaining apparatus 500 may further include a first lens 540 that condenses an infrared ray reflected by the object OBJ onto the optical modulator 510. In addition, a bandpass filter 545 that only transmits light of a predetermined wavelength band in the light reflected by the object OBJ may be further provided between the first lens 540 and the optical modulator 510. For example, the bandpass filter 545 may only transmit the light of the wavelength band emitted from the light source 505. An order of arranging the first lens 540 and the bandpass filter 545 may be changed. A second lens 550 that condenses light modulated by the optical modulator 510 onto the image sensor 515 may be further provided between the optical modulator 510 and the image sensor 515.

The light source 505 may emit the infrared ray of the multiple wavelength bands, for example, from 780 nm to 1650 nm. In greater detail, the light source 505 may emit the infrared ray of the multiple wavelength bands, for example, from 800 nm to 1600 nm.

The light source 505 may transmit light to the object OBJ according to a control signal transmitted from the controller 555. The transmitted light from the light source 505 to the object OBJ may have a form of a periodic continuous function having a predetermined period Te. For example, the transmitted light may have a waveform that is specifically defined such as a sine wave, a ramp wave, and a square wave, but may have a general waveform that is not defined. Also, the light source 505 may transmit the light to the object OBJ only for a predetermined time period periodically according to the controller 555.

The optical modulator 510 may modulate the light reflected by the object OBJ according to control of the controller 555. The optical modulator 510 may modulate a size of the transmitted light by changing a gain according to a light modulation signal having a predetermined waveform. To do this, the optical modulator 510 may have a variable gain. The optical modulator 510 may operate with a high modulation speed, for example, tens to hundreds MHz, in order to identify a phase difference of the light according to the distance or a flight time period of the light.

The image sensor 515 may form an image by detecting the light modulated by the optical modulator 510. For example, when only a distance to a point of the object OBJ is to be measured, the image sensor 515 may use a single optical sensor such as a photodiode or an integrator. Otherwise, when distances to points on the object OBJ are to be simultaneously measured, the image sensor 515 may include a one-dimensional or a two-dimensional array of a plurality of photodiodes or photodetectors. For example, the image sensor 515 may be a charge-coupled device (CCD) image sensor or a complementary metal oxide semiconductor (CMOS) image sensor having a two-dimensional array.

The signal processor 530 calculates depth information based on an output from the image sensor 515, and generates an image including the depth information. The signal processor 530 may be implemented by an integrated circuit (IC) of its own, or may be implemented as software installed in the 3D image obtaining apparatus 500. When the signal processor 530 is implemented as software, the signal processor 530 may be stored on an additional portable storage medium.

The light emitted from the light source 505 may be reflected by a surface of the object OBJ and may be incident to the first lens 540. In general, the object OBJ actually has a two-dimensional array of a plurality of surfaces having different distances, that is, depths, to a photographing surface of the 3D image obtaining apparatus 500, but FIG. 21 exemplarily shows the object OBJ having first to fifth surfaces P1 to P5 having different depths for convenience of description. When the transmitted light is reflected respectively by the first to fifth surfaces P1 to P5, five reflected rays that have been time delayed differently (that is, having different phases) may occur. Here, the reflected ray reflected by the first surface P1 that is farthest from the 3D image obtaining apparatus 500 reaches the first lens 540 after being delayed for a time period TOF1, and the reflected ray reflected by the fifth surface P5 that is closest to the 3D image obtaining apparatus 500 may reach the first lens 540 after being delayed for a time period TOF5 that is less than the time period TOF1.

The reflected rays having different time delays (or phase delays) may be incident respectively to the optical modulator 510. Before the reflected rays are incident to the optical modulator 510, background light or noise light other than the wavelength band emitted from the light source 505 may be removed by the bandpass filter 545.

The optical modulator 510 may modulate the amplitudes or phases of the reflected rays having different degrees of phase delay. The modulated light passes through the second lens 550 so that a magnification may be adjusted and the light is focused, and then, may reach the image sensor 515. The image sensor 515 receives the modulated light and converts the modulated light to an electric signal. Output signals I1 to I5 of the image sensor 515 include different depth information from one another, and the signal processor 530 calculates depth information Depth 1 to Depth 5 corresponding to the first to fifth surfaces P1 to P5 of the object OBJ and generates an image including the depth information, based on the output signals.

Figure 22:
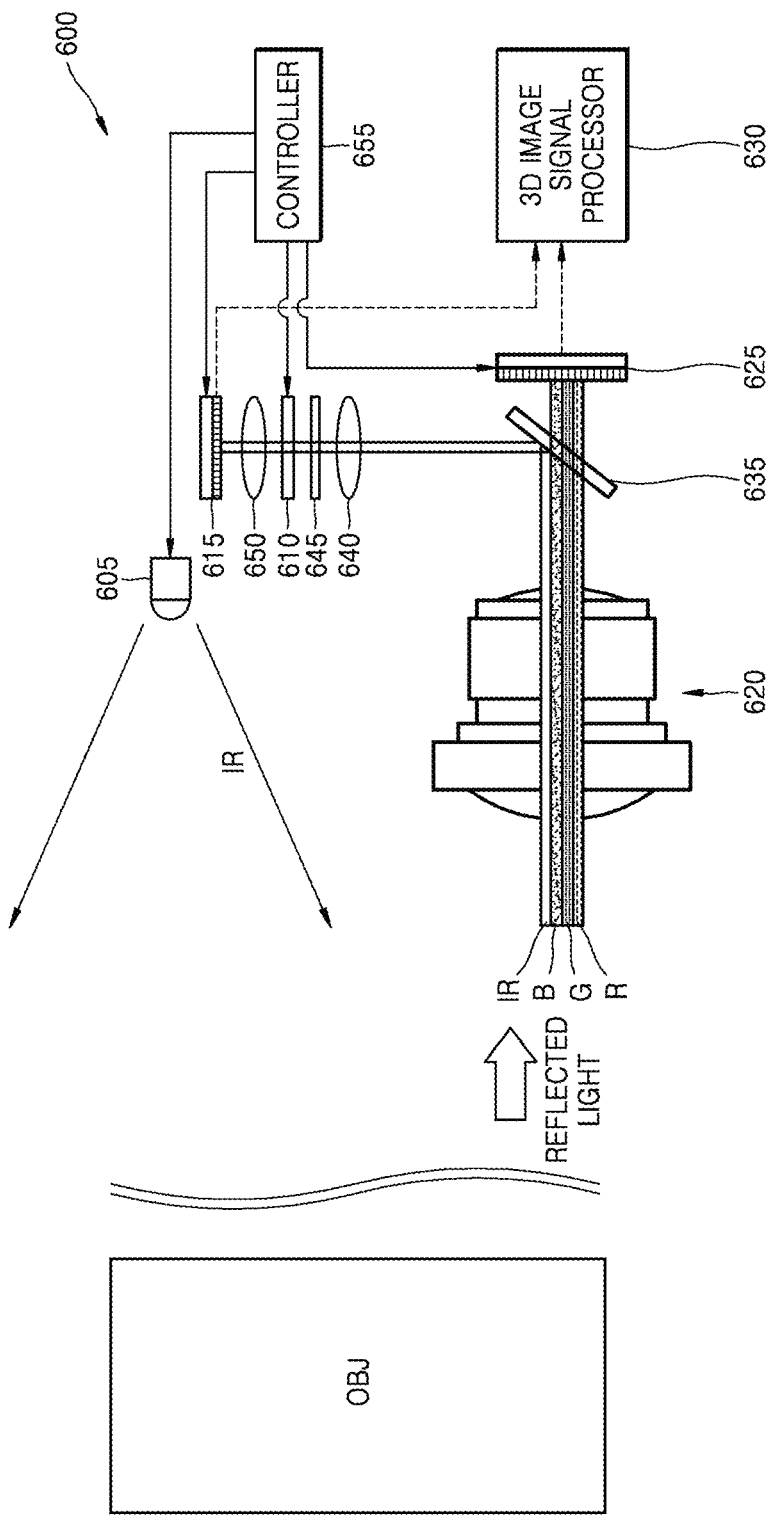
FIG. 22 is a schematic diagram of a 3D obtaining apparatus according to an exemplary embodiment.

FIG. 22 is a schematic diagram of a 3D image obtaining apparatus 600 according to an exemplary embodiment.

The 3D image obtaining apparatus 600 may extract depth information of the object OBJ by using the TOF method, with a configuration of capturing two-dimensional color images.

The 3D image obtaining apparatus 600 may include a light source 605 emitting light of multiple wavelength bands to an object OBJ, an optical modulator 610 for modulating light reflected by the object OBJ, a first image sensor 615 sensing the light modulated by the optical modulator 610 and converting sensed light into an electric signal, a second image sensor 625 converting an optical image of a visible ray band (R, G, and B) reflected by the object OBJ into electric signals, and a 3D image signal processor 630 calculating depth information and color information from the electric signals output from the first image sensor 615 and the second image sensor 625 to generate a 3D image of the object OBJ. In addition, the 3D image obtaining apparatus 600 may include a controller 655 for controlling operations of the light source 605, the optical modulator 610, the first image sensor 615, the second image sensor 625, and the 3D image signal processor 630.

The light source 605 may be the light source described above with reference to FIGS. 1 to 19. The light source 605 may emit an infrared ray (IR) of multiple wavelengths, for example, from 780 nm to 1650 nm. In more detail, the light source 605 may emit the IR of the multiple wavelengths, for example, from 800 nm to 1600 nm.

The 3D image obtaining apparatus 600 may further include a beam splitter 635 that splits the light reflected by the object OBJ as the IR proceeding toward the first image sensor 615 and a visible ray proceeding toward the second image sensor 625.

A first lens 640 may condense the IR split by the beam splitter 635 onto the optical modulator 610 and may be disposed between the beam splitter 635 and the optical modulator 610. In addition, the 3D image obtaining apparatus 600 may further include a bandpass filter 645 that selectively transmits light of a predetermined wavelength band among the light reflected by the object OBJ. For example, the bandpass filter 645 may only transmit the light of the wavelength band emitted from the light source. An order of arranging the first lens 640 and the bandpass filter 645 may be changed. A second lens 650 may condense the light modulated by the optical modulator 610 onto the first image sensor 615 and may be disposed between the optical modulator 610 and the first image sensor 615.

In FIG. 22, the IR and the visible light R, G, and B reflected by the object OBJ commonly pass through a photographing lens 620, but the optical arrangement may be changed so that the visible light R, G, and B only pass through the photographing lens 620 and the IR is incident to the optical modulator 610 without passing through the photographing lens 620.

The optical modulator 610 may modulate an amplitude or a phase of the transmitted light by varying the gain according to a light modulation signal having a predetermined waveform. The modulated light is sensed by the first image sensor 615, and the first image sensor 615 may output a signal including depth information of the object OBJ. The second image sensor 625 may output a signal including color information of the object OBJ.

The 3D image signal processor 630 may generate a 3D image signal from outputs of the first image sensor 615 and the second image sensor 625.

The 3D image obtaining apparatus according to the one or more exemplary embodiments may be applied to various fields, for example, a robot cleaner, a motion recognition digital TV (DTV), a digital security control (DSC) camera, a 3D camera, a 3D camera capable of obtaining distance information to the object, a motion sensor, and a laser radar. The 3D image obtaining apparatus may be applied to a sensor for sensing an obstacle in a robot cleaner. In addition, the 3D image obtaining apparatus may be adopted as a depth sensor for recognizing motions in a DTV. In addition, the 3D image obtaining apparatus may be applied to a verification/recognition sensor of a security camera. Also, the 3D image obtaining apparatus may be applied to various 3D image obtaining apparatuses that allow a user to create 3D content.

FIGS. 23 to 26 are diagrams illustrating a method of manufacturing an edge emitting laser light source, according to an exemplary embodiment.

Figure 23:
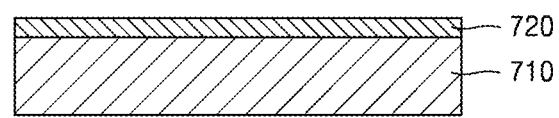
FIGS. 23 to 26 are diagrams of a method of manufacturing the edge emitting laser light source of FIG. 1.
Figure 24:
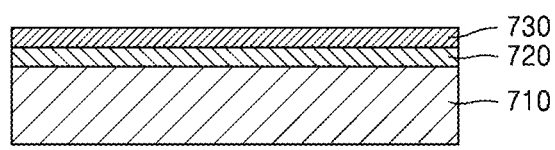

Referring to FIG. 23, an active layer 720 may be stacked on a substrate 710. The substrate 710 may include GaAs. The active layer 720 may include a quantum well layer. Referring to FIG. 24, a thin film 730 may be stacked on the active layer 720. The thin film 730 may include a compound including a combination of one or more of In, Ga, Al, As, and P, and a combination including one or more among a dielectric material including a combination of one or more of $SiO_2$, $SiNx$, $TiO_2$, $MgF_2$, $Al_2O_3$, $Ta_2O_5$, polymer, and metal.

Figure 25:
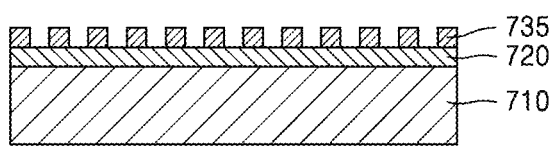

Referring to FIG. 25, the thin film 730 is patterned to form grating regions 735. The grating regions 735 may include a plurality of regions having different grating array structures. The grating regions including a plurality of grating array structures may be formed by performing an etching process once. Light of multiple wavelength bands may be selected by the plurality of grating regions 735.

Figure 26:
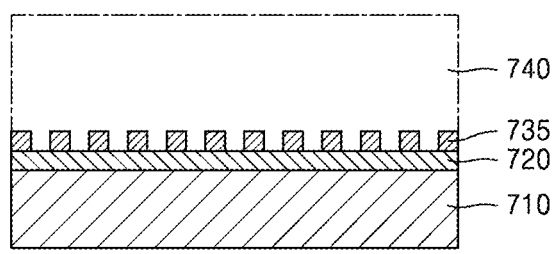

Referring to FIG. 26, a gain section 740 may be formed on the grating regions 735.

FIGS. 27 to 31 are diagrams illustrating a method of manufacturing an edge emitting laser light source, according to an exemplary embodiment.

Figure 27:
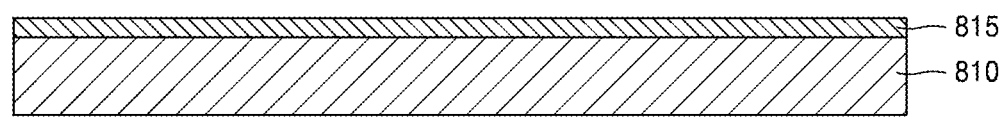
FIGS. 27 to 31 are diagrams of a method of manufacturing the edge emitting laser light source of FIG. 14.
Figure 28:
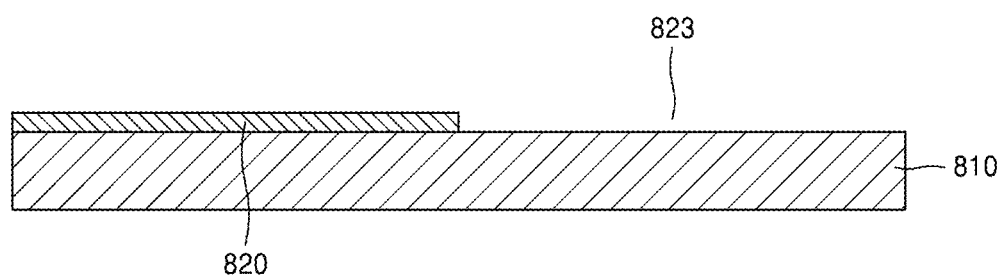
Figure 29:
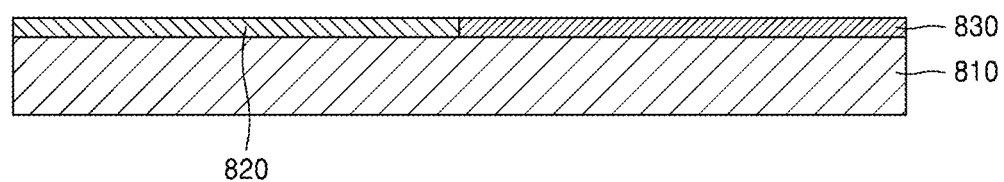
Figure 30:
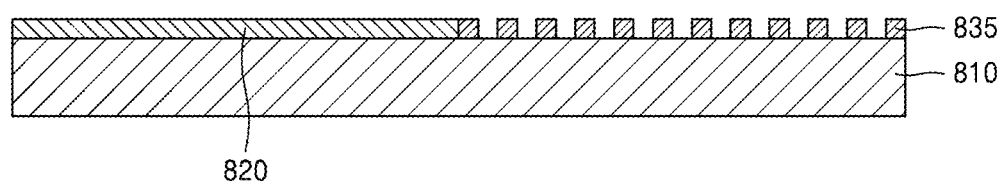

Referring to FIG. 27, an active layer 815 may be stacked on a substrate 810. Referring to FIG. 28, a part 823 of the active layer 815 may be etched. Referring to FIG. 29, a thin film 830 may be stacked on the part 823 that is etched. Referring to FIG. 30, the thin film 830 is patterned to form grating regions 835. The grating regions 835 may include a plurality of regions having different grating array structures. The grating regions 835 including a plurality of grating array structures may be formed by performing an etching process once. The grating regions 835 may be formed at the same layer level as that of the active layer 820. Light of multiple wavelength bands may be selected by the plurality of grating regions 835.

Figure 31:
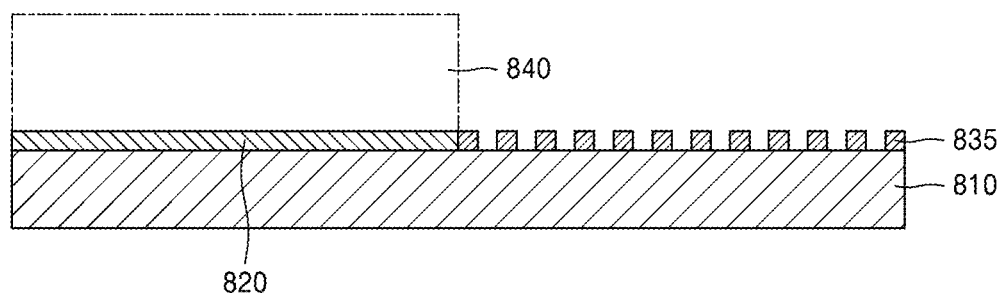

Referring to FIG. 31, a gain section 840 may be formed on the active layer 820.

According to the method of manufacturing the edge emitting laser light source of the one or more embodiments, the plurality of grating regions emitting the light of the multiple wavelength bands are formed on one substrate so that the edge emitting laser light source of multiple wavelengths may be manufactured as a single chip structure. Since the edge emitting laser light source of multiple wavelengths is manufactured as the single chip structure, a volume of the light source may be reduced, and the manufacturing processes may be simplified. Due to the single chip structure, unevenness between the wavelengths of the plurality of grating regions may be reduced.

Also, according to the one or more embodiments, the edge emitting laser light source may emit the light having two or more wavelength bands so as to reduce the speckle, and the variation in the wavelength characteristic according to the temperature variation may be similar to that of the optical modulator because of the plurality of grating array structures. Thus, degradation in sensing the depth of the object due to the temperature variation may be reduced.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An edge emitting laser light source comprising:
   a substrate;
   an active layer disposed on the substrate;
   a wavelength selection section comprising grating regions configured to select wavelengths of light emitted from the active layer, and
   a gain section configured to resonate the light having the selected wavelengths in a direction parallel with the active layer,
   wherein the grating regions comprise a first grating region and a second grating region which are arranged in a first direction,
   wherein the first grating region comprises a plurality of first lands that are arranged in a second direction perpendicular to the first direction, and the second grating region comprises a plurality of second lands that are arranged in the second direction, and
   wherein an interval between the plurality of first lands in the first grating region is different from an interval between the plurality of second lands in the second grating region, and the plurality of first lands in the first grating region are disposed to be in direct contact with the plurality of second lands in the second grating region.

2. The edge emitting laser light source of claim 1, wherein the grating regions are disposed at least one of between the active layer and the gain section and between the substrate and the active layer.

3. The edge emitting laser light source of claim 2, wherein the grating regions are arranged in a direction parallel with a light emitting direction from the gain section.

4. The edge emitting laser light source of claim 1, wherein a first land and a last land of the plurality of first lands which are placed in a first row and a last row of the grating regions are aligned with a first land and a last land of the plurality of second lands which are placed in the first row and the last row of the grating regions, respectively, and
   wherein a number of the plurality of first lands located between the first row and the last row is different from a number of the plurality of second lands located between the first row and the last row.

5. The edge emitting laser light source of claim 1, wherein the gain section comprises a light emitting surface and a reflective surface, and the grating regions are disposed on at least one of a front portion of the light emitting surface and a rear portion of the reflective surface.

6. The edge emitting laser light source of claim 1, wherein the grating regions are arranged in parallel with a light emitting direction from the gain section.

7. The edge emitting laser light source of claim 6, wherein the grating regions are arranged in parallel with the substrate.

8. The edge emitting laser light source of claim 1, wherein the grating regions are configured to select light of different wavelengths according to grating array structures of the grating regions.

9. The edge emitting laser light source of claim 1, wherein the light circulates on a surface of the gain section in the direction parallel with the active layer.

10. The edge emitting laser light source of claim 1, wherein the edge emitting laser light source has an integrated single chip structure.

11. The edge emitting laser light source of claim 1, wherein the active layer has a multi-quantum well structure.

12. The edge emitting laser light source of claim 1, wherein the grating regions comprise a material including at least one of In, Ga, As, and P.

13. The edge emitting laser light source of claim 1, wherein the grating regions comprise a combination of a dielectric material comprising at least one of $SiO_2$, SiNx, $TiO_2$, $MgF_2$, $Al_2O_3$, and $Ta_2O_5$, a polymer, and metal.

14. The edge emitting laser light source of claim 1, wherein the wavelengths selected within the grating regions range from 780 nm to 1650 nm.

15. The edge emitting laser light source of claim 1, wherein the substrate comprises a GaAs substrate that is in direct contact with the active layer.

16. The edge emitting laser light source of claim 1, further comprising:
a first type clad layer disposed between the substrate and the active layer; and
a second type clad layer disposed on the active layer.

17. A three-dimensional (3D) image obtaining apparatus comprising:
an edge emitting laser light source configured to emit light of multiple wavelength bands;
an optical modulator configured to modulate the light emitted from the edge emitting laser light source and reflected by an object; and
an image sensor configured to sense the light modulated by the optical modulator,
wherein the edge emitting laser light source comprises:
a substrate;
an active layer disposed on the substrate;
a wavelength selection section comprising grating regions configured to select wavelengths of light emitted from the active layer; and
a gain section configured to resonate the light having the selected wavelengths in a direction parallel with the active layer, and
wherein the grating regions comprise a first grating region and a second grating region which are arranged in a first direction,
wherein the first grating region comprises a plurality of first lands that are arranged in a second direction perpendicular to the first direction, and the second grating region comprises a plurality of second lands that are arranged in the second direction, and
wherein an interval between the plurality of first lands in the first grating region is different from an interval between the plurality of second lands in the second grating region, and the plurality of first lands in the first grating region are disposed to be in direct contact with the plurality of second lands in the second grating region.

18. The 3D image obtaining apparatus of claim 17, wherein the grating regions are disposed at least one of between the active layer and the gain section and between the substrate and the active layer.

19. The 3D image obtaining apparatus of claim 18, wherein the grating regions are disposed outside the gain section.

20. The 3D image obtaining apparatus of claim 19, wherein the gain section comprises a light emitting surface and a reflective surface, and the grating regions are disposed on at least one of a front portion of the light emitting surface and a rear portion of the reflective surface.

21. The 3D image obtaining apparatus of claim 18, wherein the light circulates on a surface of the gain section in the direction parallel with the active layer.

* * * * *